(12) United States Patent
Rossland et al.

(10) Patent No.: US 10,259,120 B2
(45) Date of Patent: Apr. 16, 2019

(54) COMPACT RESOLVER PRE-AMPLIFICATION ASSEMBLY (RPA) MODULE

(71) Applicant: THE GOVERNMENT OF THE UNITED STATES OF AMERICA, AS REPRESENTED BY THE SECRETARY OF THE NAVY, Washington, DC (US)

(72) Inventors: Eric Rossland, Alexandria, VA (US); Mark Fratta, Harwood, MD (US); Greg Levanas, Costa Mesa, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 56 days.

(21) Appl. No.: 15/153,413

(22) Filed: May 12, 2016

(65) Prior Publication Data
US 2016/0332307 A1 Nov. 17, 2016

Related U.S. Application Data

(60) Provisional application No. 62/160,179, filed on May 12, 2015.

(51) Int. Cl.
*B25J 13/08* (2006.01)
*H03M 1/48* (2006.01)

(52) U.S. Cl.
CPC .......... *B25J 13/088* (2013.01); *H03M 1/485* (2013.01)

(58) Field of Classification Search
CPC .............................. B25J 13/088; H03M 1/485
See application file for complete search history.

(56) References Cited

U.S. PATENT DOCUMENTS

| | | | | |
|---|---|---|---|---|
| 6,002,250 A | * | 12/1999 | Masreliez | G01D 5/2053 324/207.16 |
| 6,389,373 B1 | * | 5/2002 | Ohya | H03M 1/485 347/116 |
| 2007/0219733 A1 | * | 9/2007 | Kawaguchi | G01D 5/2046 702/66 |

OTHER PUBLICATIONS

Low cost 12 Bits Resolver to Digital Converter Datasheet by Analog Devices, Inc. published in 1999.*

* cited by examiner

*Primary Examiner* — Muhammad S Islam
(74) *Attorney, Agent, or Firm* — US Naval Research Laboratory; Richard F. Bis

(57) ABSTRACT

A compact resolver pre-amplification assembly has first and second printed circuit boards. The boards include an interface with an N/N−1 resolver and a resolver-to-digital converter and three signal paths. The first and second circuit boards are contained in a single package configured for mounting on a robotic joint while providing high amplification and noise rejection. Low level sensitive signal are separated from high level excite signals by locating sensitive signals on the first board and excite signals on the second board.

20 Claims, 17 Drawing Sheets

COMPACT RESOLVER PRE-AMPLIFICATION ASSEMBLY (RPA) MODULE

RELATED APPLICATIONS

This application claims the benefit of U.S. Provisional Application No. 62/160,179 filed May 12, 2015, which is hereby incorporated herein by reference.

FIELD OF INVENTION

The present invention relates generally to accurate robotic arm joint absolute position telemetry.

BACKGROUND

Mars Science Laboratory (MSL) arms on Opportunity and Spirit both use potentiometers to report robotic arm joint position. A potentiometer is a low-accuracy feedback device.

The MSL arm on Curiosity was the first Mars arm to transition away from potentiometers and implemented resolvers to provide joint position feedback. The system experienced noise issues, and no pre-amp electronics were incorporated because that arm could not support the size and mass of pre-amp electronics available at that time. Without pre-amp electronics, the resolver output position telemetry became unusable. Motor encoders (which did not support joint output sensing) were installed to support joint position knowledge.

The NASA Goddard Flight Telerobotic Servicer (FTS) arms incorporated resolver-based position sensors to report joint position. These arms were planned for use on the International Space Station (ISS), but they were never flown.

The German Aerospace Center (known as DLR) built and demonstrated the Robot Technology Experiment (ROTEX), a small robotic arm which incorporated an early version of joint position sensing, in a Spacelab experimentation rack. DLR's Robotics Component Verification on the ISS (ROKVISS) was a 2-DOF arm which built upon lessons learned from ROTEX, implementing magnetoresistive encoders to report joint position. Both ROTEX and ROKVISS were used in the LEO environment.

The European Robotic Arm (ERA), similar to the Space Station Remote Manipulator System (SSRMS) and JEM-SRMS, was a large, relocatable, symmetrical arm built for use on the Russian Multipurpose Laboratory module of the ISS. The ERA will work with the Russian airlock to transfer small payloads directly from inside to outside the ISS. It will be teleoperated by astronauts from inside or outside the ISS. The ERA is designed and assembled by Dutch Space. The ERA joint position is determined from the difference between a joint position set point and the joint position measurements of an optical position sensor. It also uses the difference between a velocity set point and motor velocity position measurement provided by a resolver.

SUMMARY OF INVENTION

Space-qualified absolute encoders come from primarily one source, and as a result, are very expensive and long-lead. They are typically larger in size, more fragile, and have radiation concerns at GEO environment levels. The joint position sensing systems mentioned above are not able to support the same combination of environmental, performance, and packaging requirements exemplary modules provide.

The Front-end Robotics Enabling Near-term Demonstration (FREND) MKII robotic arm requires high accuracy of joint position knowledge and thus incorporates an exemplary Resolver Preamp Assembly (RPA) module and Inductosyn absolute position sensing system. Exemplary RPA modules provide a small form factor package with parts that are radiation-tolerant in the GEO-environment radiation, so it may be co-located at each joint to maintain robotic arm dexterity, thus allowing the arm to meet performance requirements.

The Resolver Preamp Assembly (RPA) module must receive and amplify sensitive Inductosyn signals while reducing any potential noise amplification in order to maintain signal integrity and provide accurate joint position. To reduce noise amplification in the system, the RPA module needs to be located in close proximity of the Inductosyn at each joint and thus compact in size to maintain joint range of motion and robotic arm dexterity. The Compact RPA Module is planned to support missions at geosynchronous orbits thus must also be designed to meet the electromagnetic interference and radiation environmental requirements.

According to one aspect of the invention, a compact resolver pre-amplification assembly has first and second printed circuit boards. The circuit boards include an interface with an N/N−1 resolver and a resolver-to-digital converter; a first signal path including circuitry configured to drive a field director and Inductosyn primaries, wherein the first signal path is configured to receive a differential signal from robotic control electronics, condition the signal, and then amplify the signal, driving the field director and Inductosyn primaries; a second signal path including circuitry configured to amplify, condition, and output, to a differential output, sine (Sin) and cosine (Cos) outputs from a field director secondary; and a third signal path including circuitry configured to amplify, condition, and convert, to a differential signal, sine and cosine outputs from an Inductosyn secondary. The first and second circuit boards are contained in a single package configured for mounting on a robotic joint, and low level sensitive signals are separated from high level excite signals by locating sensitive signals on the first board and excite signals on the second board.

Optionally, the compact resolver pre-amplification assembly of any preceding claim includes an excite drive circuit having a differential line receiver, a phase adjustment circuit, and a power output stage configured to drive the Inductosyn primary.

Optionally, the compact resolver pre-amplification assembly includes recovery amplifiers configured to provide high gain, amplifying recovered Sin and Cos signals for input to a resolver-to-digital converter.

Optionally, the recovery amplifiers include three amplifier stages and a unity gain differential line drive circuit driving amplified signals to the resolver-to-digital converter.

Optionally, the first gain stage includes a 10:1 input transformer configured to provide galvanic isolation and high common-mode rejection and RF filtering, reducing the coupling of anomalous signals into the amplifiers.

Optionally, the transformer has a low primary resistance to minimize Johnson noise and is housed in a magnetic shield.

Optionally the compact resolver pre-amplification assembly includes a line driver circuit including inverting and non-inverting unity gain amplifiers configured to provide a differential signal output to interface with resolver-to-digital converter receivers and interconnecting cables. The line driver circuit is configured to provide a low output impedance while isolating the driver circuit from the cable capacitance to ensure stability.

Optionally, the line driver circuit provides a DC feedback path taken from outside of an isolation resistor lowering the output impedance, and an AC feedback path taken directly at an op-amp output ensuring high frequency stability.

Optionally, the compact resolver pre-amplification assembly includes power supply decoupling capacitors on input power rails.

Optionally, the compact resolver pre-amplification assembly includes a bulk RC filter configured to provide a second stage of filtering for all high gain amplifier stages; and an individual RC filter for each op-amp of the recovery amplifiers.

Optionally, the printed circuit boards include multiple layers shielding and isolating signals.

Optionally, the printed circuit boards include circuit functions and routing arranged to provide minimal signal coupling with adjacent circuits.

Optionally, individual layers include isolated ground planes and guard rings to isolate sensitive circuitry.

Optionally, Inductosyn 127× and 128×SIN and COS signals are treated as four separate analog channels and are segregated to separate pre-amp islands each associated with respective segmented underlying ground planes, preventing inner channel currents from coupling with one another.

Optionally, the input signal path is routed in a sub-layer surrounded by segmented ground planes thereby reducing noise coupling, and downstream of the pre-amp, the segmented ground planes are joined as one analog ground plane in a star ground.

Optionally, isolation between the excite drive signal and the high-gain amplifiers exceeds 50 dB while providing gains that range from 3000 to 5000.

Optionally, isolation between sine and cosine amplifiers exceeds 60 dB.

Optionally, the first board includes twelve layers. Layer 2 includes a first segmented ground plane; layer 3 includes two sensitive signal routings; layer 4 includes a second segmented ground plane; layer 9 includes a third segmented ground plane; layer 10 includes two sensitive signal routings separate from the signal routings on layer 3; and layer 11 includes a fourth segmented ground plane.

Optionally, the first board includes twelve layers and layer 3 includes two sensitive signal routings, each routing being enclosed by a respective guard ring, shielding input signals upstream of transformers; and layer 10 includes two sensitive signal routings separate from the signal routings on layer 3, each routing being enclosed by a respective guard ring, shielding input signals upstream of transformers.

Optionally, the first board includes twelve layers and layers 5, 6, 7, and 8 each include a power plane separated into two channels that are connected at one point, thereby preventing noise from flowing between adjacent circuits.

Optionally, the compact resolver pre-amplification assembly is in combination with a robotic arm and a second compact resolver pre-amplification assembly. The compact resolver pre-amplification assemblies are mounted on and receive information from respective joints of the robotic arm.

The foregoing and other features of the invention are hereinafter described in greater detail with reference to the accompanying drawings.

DETAILED DESCRIPTION

The Compact Resolver Preamp Assembly (RPA) Module reports absolute joint position from each joint on a robotic arm and then outputs that information to the robotic arm control electronics to support overall robotic arm system control.

Figure 1:
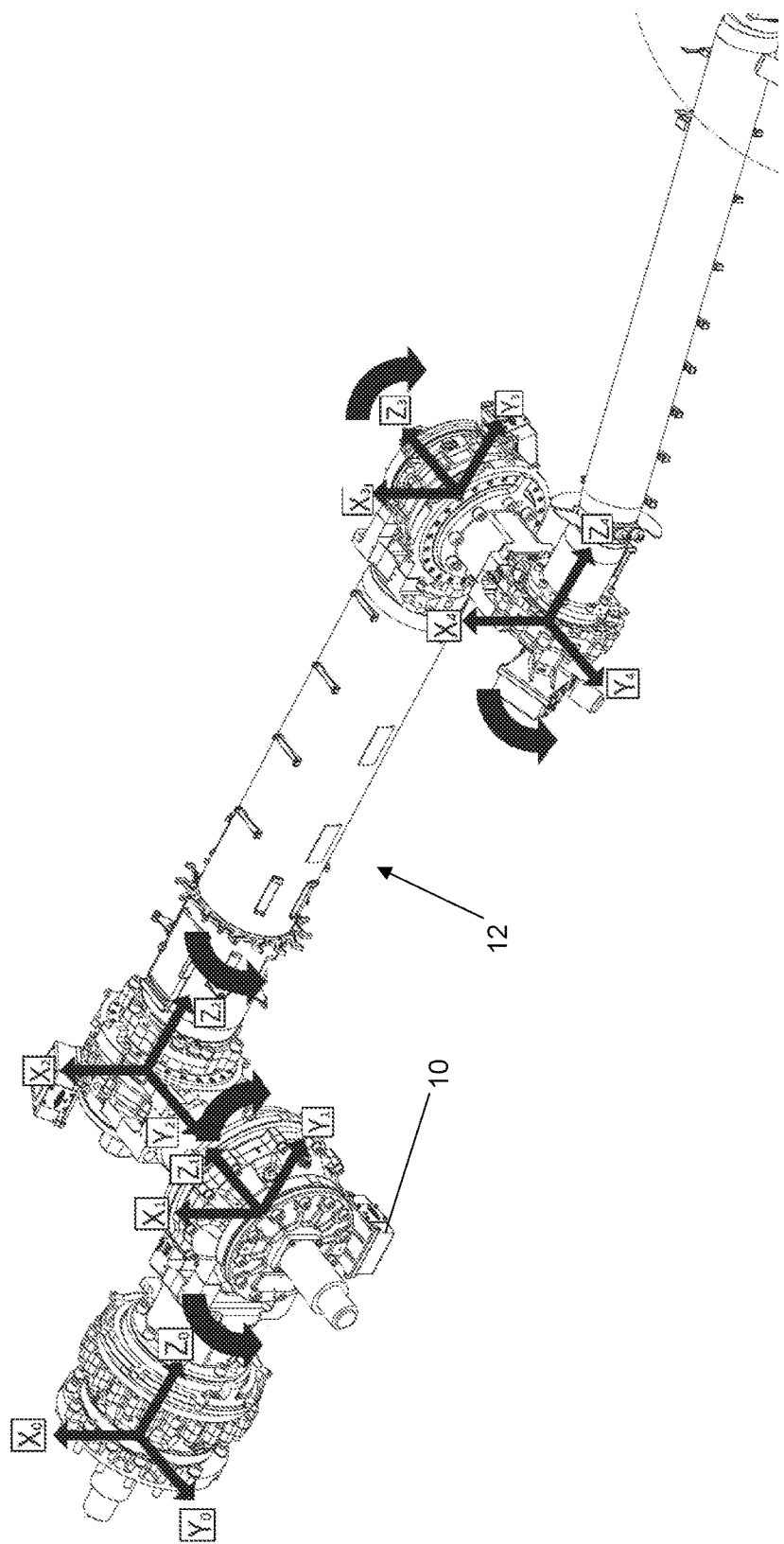
FIG. 1 shows a robotic arm equipped with an exemplary RPA module.

Specifically exemplary compact RPA modules support the space environment in geosynchronous orbit through the use of space qualified components. As shown in FIG. 1, an exemplary compact RPA module 10 may be installed at each of the joints of a robotic arm 12 to provide absolute motor position in order to support autonomous grapple capabilities. It is noted that part types can be replaced with similar Commercial Off-The-Shelf (COTS) parts to support terrestrial applications allowing for more efficient designs and motor control of applications utilizing Inductosyns.

Exemplary RPA modules may be remotely mounted in close proximity to an Inductosyn resolver and interface with an N/N−1 resolver and a resolver-to-digital converter. This allows the excite drive signal and recovery amplifiers to be located with each Inductosyn sensor used in the system. The design provides packaging advantages for a system with multiple resolvers.

The output signal amplitude of an Inductosyn transducer is significantly smaller than the input signal amplitude. Therefore, a high gain amplifier is required to increase the amplitude of the output signals to the level required by the resolver-to-digital conversion electronics.

Exemplary RPA modules may be used where low noise and large signal gains are required. The disclosed exemplary circuit contains both the excite drive signal used to drive the primary side of the Inductosyn and the recovery amplifiers that amplify the signals from the Inductosyn secondary.

Exemplary RPA modules address the main sources of errors that occur with Inductosyn resolver systems. These errors include phase shift, amplitude imbalance, and rejection of the carrier frequency and other anomalous signals.

One of the most difficult sources of error is the rejection of anomalous signals. The main source of this error is crosstalk of the carrier frequency into the high gain recovery amplifiers. This crosstalk occurs through ground loops, stray pickup, and carrier frequency ripple components coupled into the power rails. Rejection of anomalous signals is especially difficult when the excite drive signal and high gain recovery amplifiers are in close proximity. Conventional designs require that the excite drive circuit be well-isolated from the recovery amplifiers. This separation is required since crosstalk from the excite drive signal into the recovery amplifier circuits causes position errors when these signals are processed by the resolver-to-digital converter.

Figure 2:
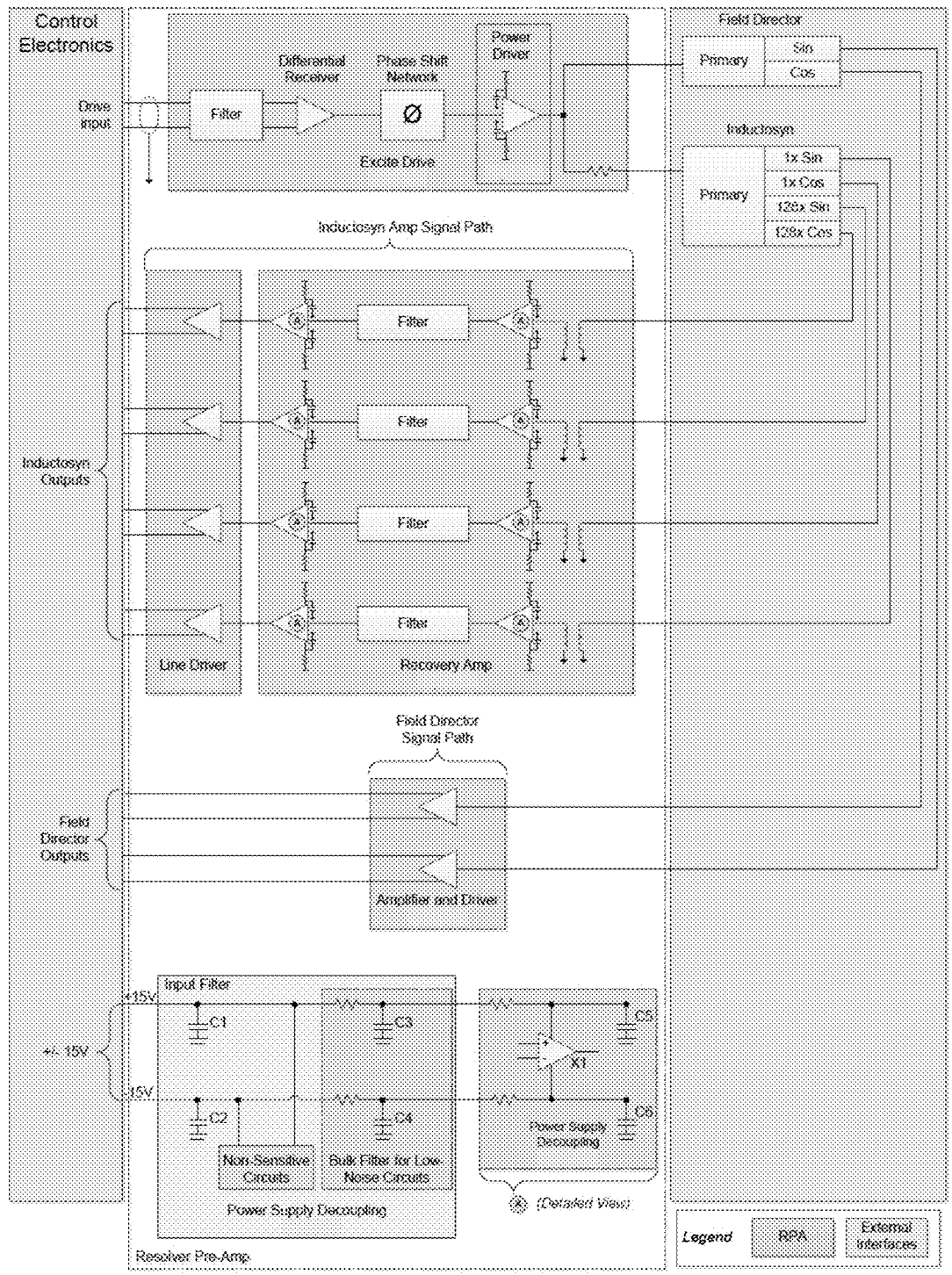
FIG. 2 shows a functional block diagram of an exemplary RPA module.

A primary advantage of exemplary RPA modules is the ability to reject anomalous signals while housing both the excite drive circuit and high gain recovery amplifiers in a small compact assembly. Detailed design descriptions for each RPA functional area shown in FIG. 2 is detailed below.

Figure 3:
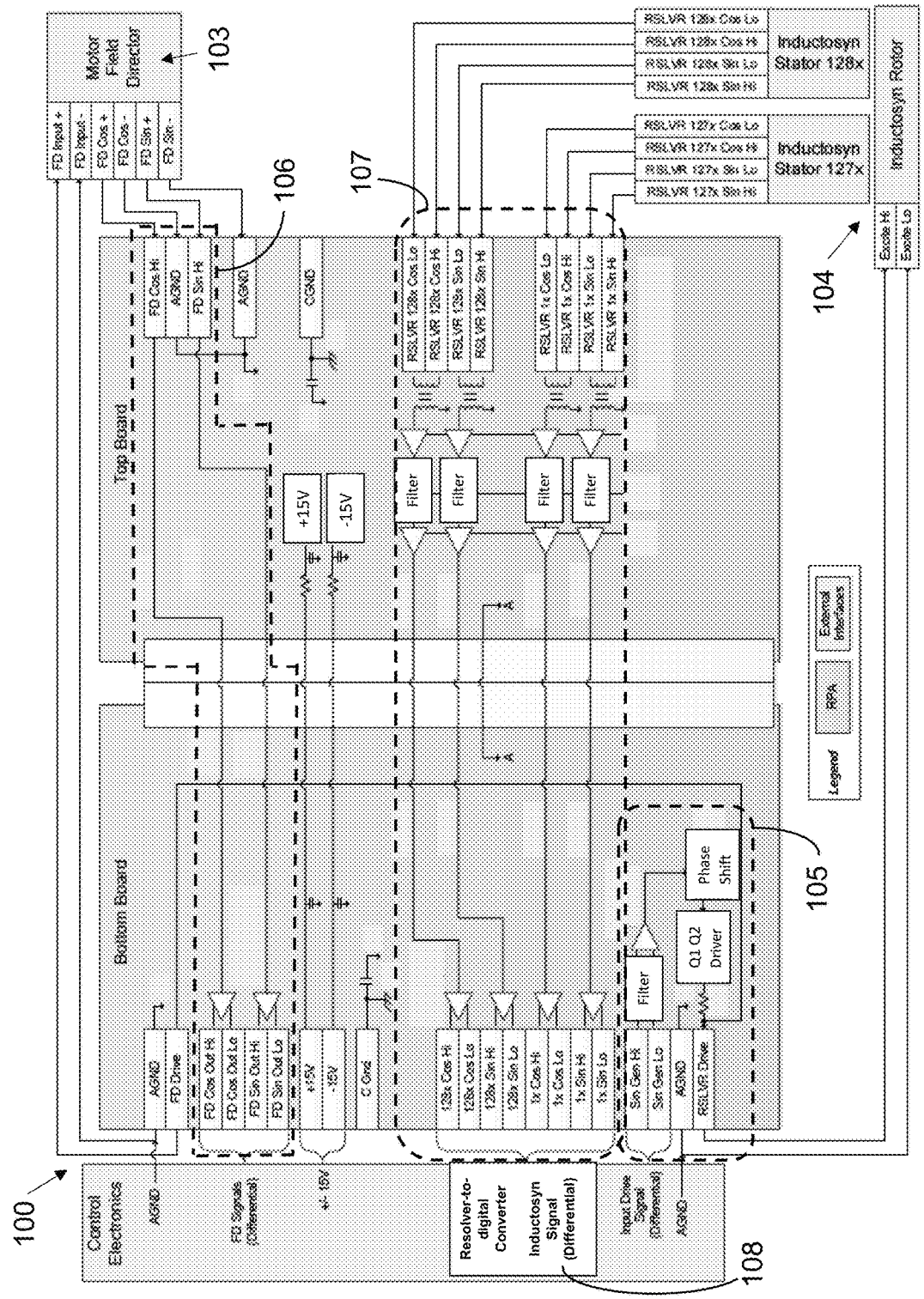
FIG. 3 shows a block diagram of an exemplary RPA module.

Preliminarily, the top level block diagram in FIG. 3 depicts an exemplary RPA module 100 dual-board PCB/PWB design consisting of a first (in an exemplary embodiment, a bottom) board 101, which incorporates the high-level field director and Inductosyn drive signals, and a second (in an exemplary embodiment, a top) board 102, which reads and amplifies the small amplitude Inductosyn output signals. The dual board configuration separates the low level sensitive signals from the high level excite signals. The low level sensitive signals are located on the top board and the excite signals are located on the bottom board. The separate board configuration provides physical separation between the boards providing isolation between the circuit functions.

The RPA module interfaces to the field director 103 and Inductosyn 104 located at each arm joint. The RPA module contains three signal paths. The first signal path 105 includes circuitry that drives the field director and Inductosyn primaries. The circuit receives a differential signal from the robotic control electronics, conditions it, and then amplifies this signal in order to drive the field director and Inductosyn primaries. The second signal path 106 amplifies the sine (Sin) and cosine (Cos) outputs from the field director secondary, conditions those signals, and converts them to a differential output. This signal is then output to the control electronics, specifically to the resolver-to-digital converter 108, described below with reference to FIGS. 5-7. The last signal path 107 amplifies the sine and cosine outputs from the Inductosyn secondary, conditions those signals, and converts them to a differential output. These signals are also output to the control electronics.

Figure 4:
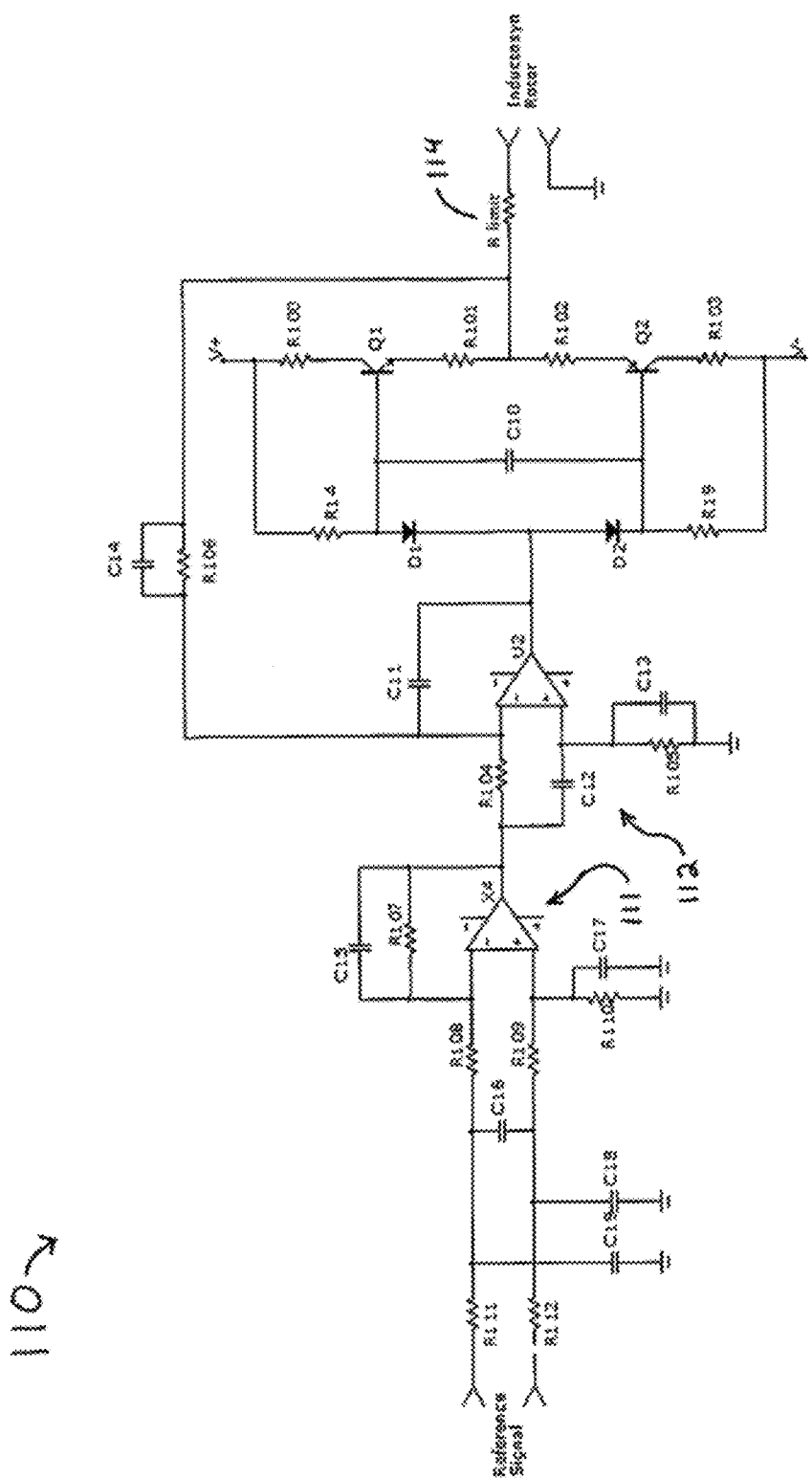
FIG. 4 shows an excite drive portion of an exemplary RPA module.

The excite drive circuit 110, schematically represented in FIG. 4, includes a differential line receiver, a phase adjustment circuit, and a power output stage to drive the Inductosyn rotor (primary).

The input circuit consists of operational amplifier 111, which converts the differential input signal to a single ended output. The input circuit contains differential and common-mode filtering to limit the input signal bandwidth and reduce noise. The gain of the circuit is less than one since, in this application, the input signal is large. The output of 111 feeds a phase shift circuit 112 consisting of op-amp 113 and its associated components. This circuit can be configured to add phase lead or lag to the excite drive signal. The phase adjustment can be used to ensure the phase alignment of the reference and recovered signals at the resolver-to-digital converter. Including the phase shift circuit within the excite drive amplifier allows individual phase adjustment when multiple resolvers are used in a system. The phase shift circuit drives an output stage that provides current drive to the resolver primary. The driver stage is enclosed within a feedback loop to set the operating point and reduce signal distortion. The driver circuit is current limited and can operate from 400 Hz to 25 kHz. The driver contains filter components that reduce the excite drive signal coupling into the power rails. The series current limiting resistor 114 is chosen to limit the drive current to the appropriate level for the Inductosyn unit selected.

Figure 5:
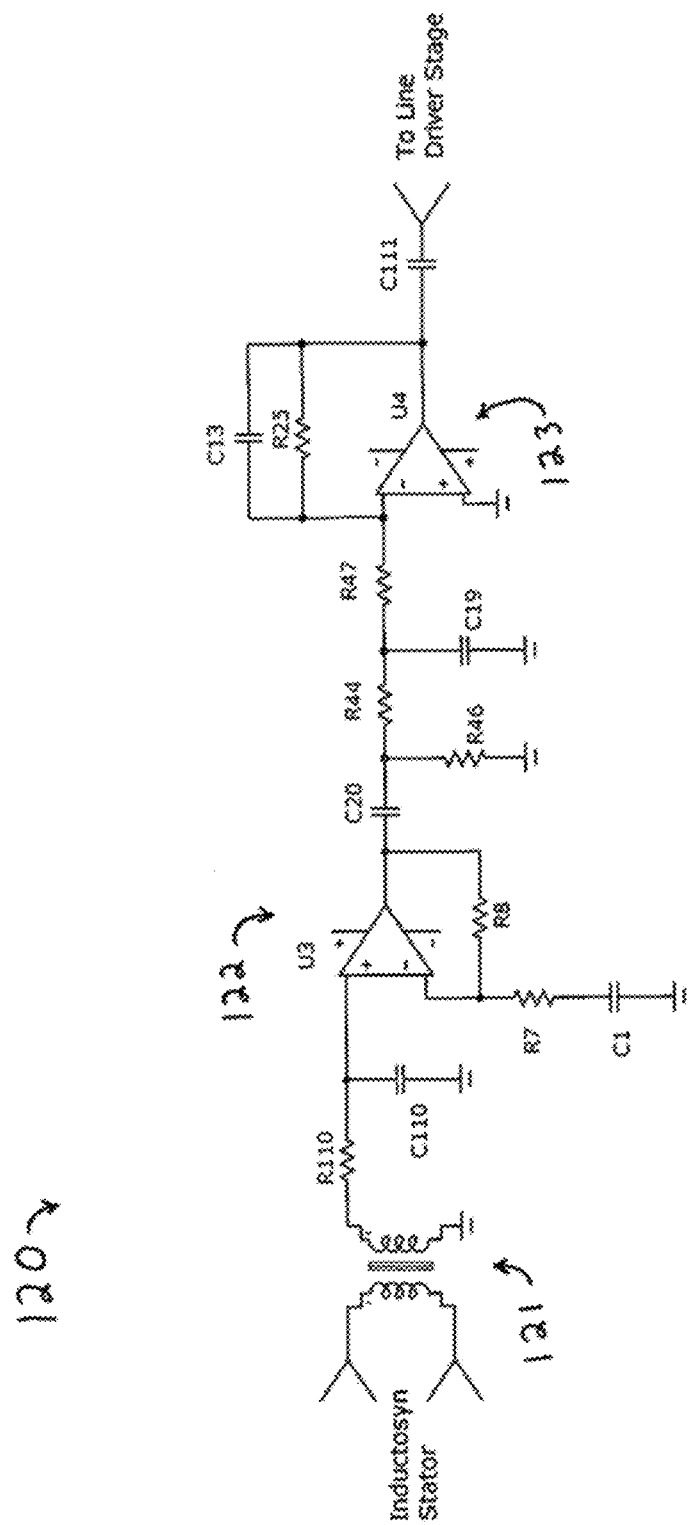
FIG. 5 shows an Inductosyn recover amplifiers portion of an exemplary RPA module.

The outputs of the Inductosyn stator (secondary) are fed to the recovery amplifiers 120 to bring the low level signals to line levels. The recovery amplifiers 120, schematically shown in FIG. 5, provide very high gain (3000-5000) to amplify the recovered Sin and Cos signals to a level where they can be processed by the resolver-to-digital converter. The recovery amplifier chain includes three amplifier stages and a unity gain differential line drive circuit. The line driver circuit drives the amplified signals through interconnecting cables to the resolver-to-digital converter electronics.

The first gain stage includes of a 10:1 input transformer to provide galvanic isolation and increase the signal-to-noise ratio. The transformer 121 provides high common-mode rejection and RF filtering, reducing the coupling of anomalous signals into the amplifier chain. The transformer 121 and the first op amp gain stage 122 set the overall signal-to-noise ratio of the amplifier chain. Since the amplifier gain is very high, a low noise floor ensures an adequate signal-to-noise ratio. The transformer has a low primary resistance to minimize Johnson noise (electronic noise generated by thermal agitation of charge carriers inside an electrical conductor at equilibrium, which happens regardless of any applied voltage) and is housed in a magnetic shield to minimize stray signal pickup.

The transformer secondary is connected to op-amp 123, a non-inverting low noise gain stage. A low pass filter is provided at the input to the op-amp to roll off noise above 25 kHz. Op-amp 123 can be set to provide between 20 dB and 50 dB by selection of the feedback components. The stage is configured as an AC amplifier with the gain dropping to unity at DC. This configuration minimizes the DC offset at the output of the amplifier to improve dynamic range. The output of this stage is coupled to a band pass filter that attenuates the noise level by 6 dB. The filter bandwidth is wide to ensure a flat gain and phase response at the carrier operating frequency. The next stage consists of an inverting amplifier 125 that provides the final amplification stage. The gain can be set to provide between 20 dB and 50 dB by selection of the feedback components. The output of this stage is AC coupled to the differential cable driver stage so that any DC offsets that may be present are blocked from reaching the line driver stage.

Figure 6:
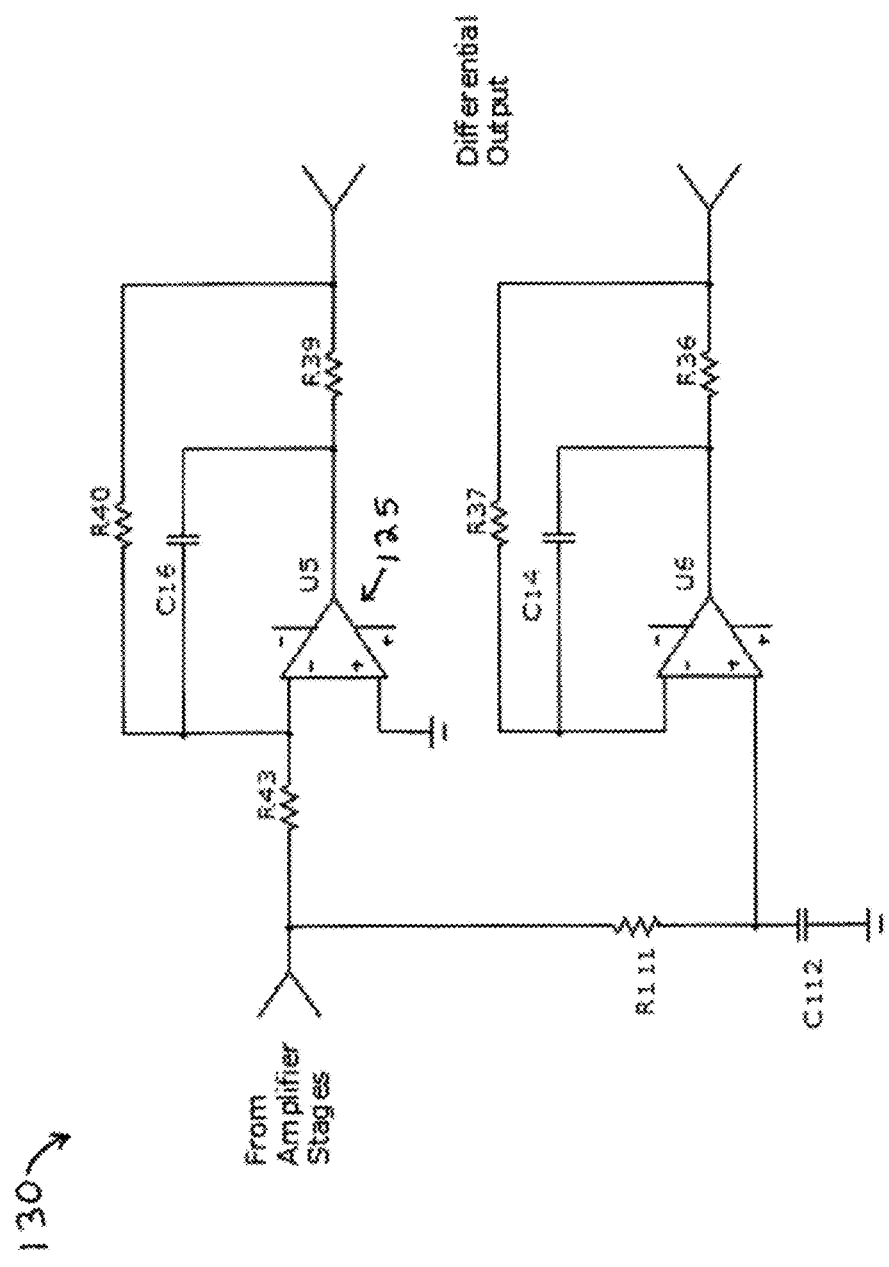
FIG. 6 shows a line driver portion of an exemplary RPA module.

The line driver circuit 130, schematically shown in FIG. 6, includes inverting and non-inverting unity gain amplifiers that provide a differential signal output to interface with the resolver-to-digital converter receivers and interconnecting cables. The driver design provides a low output impedance while isolating the driver from the cable capacitance to ensure stability. The low output impedance ensures high common-mode rejection at the receiver. To provide low output impedance and isolation from the interconnecting cable capacitance, the circuit provides two feedback paths. DC feedback is taken from the outside of the isolation resistor lowering the output impedance. AC feedback is taken directly at the op-amp output ensuring high frequency stability. Phase compensation is also provided to compensate for the bandwidth differences between the inverting and non-inverting op-amp configuration used in the driver circuit. The compensation ensures that the differential output signals are exactly 180 degrees out of phase.

Figure 7:
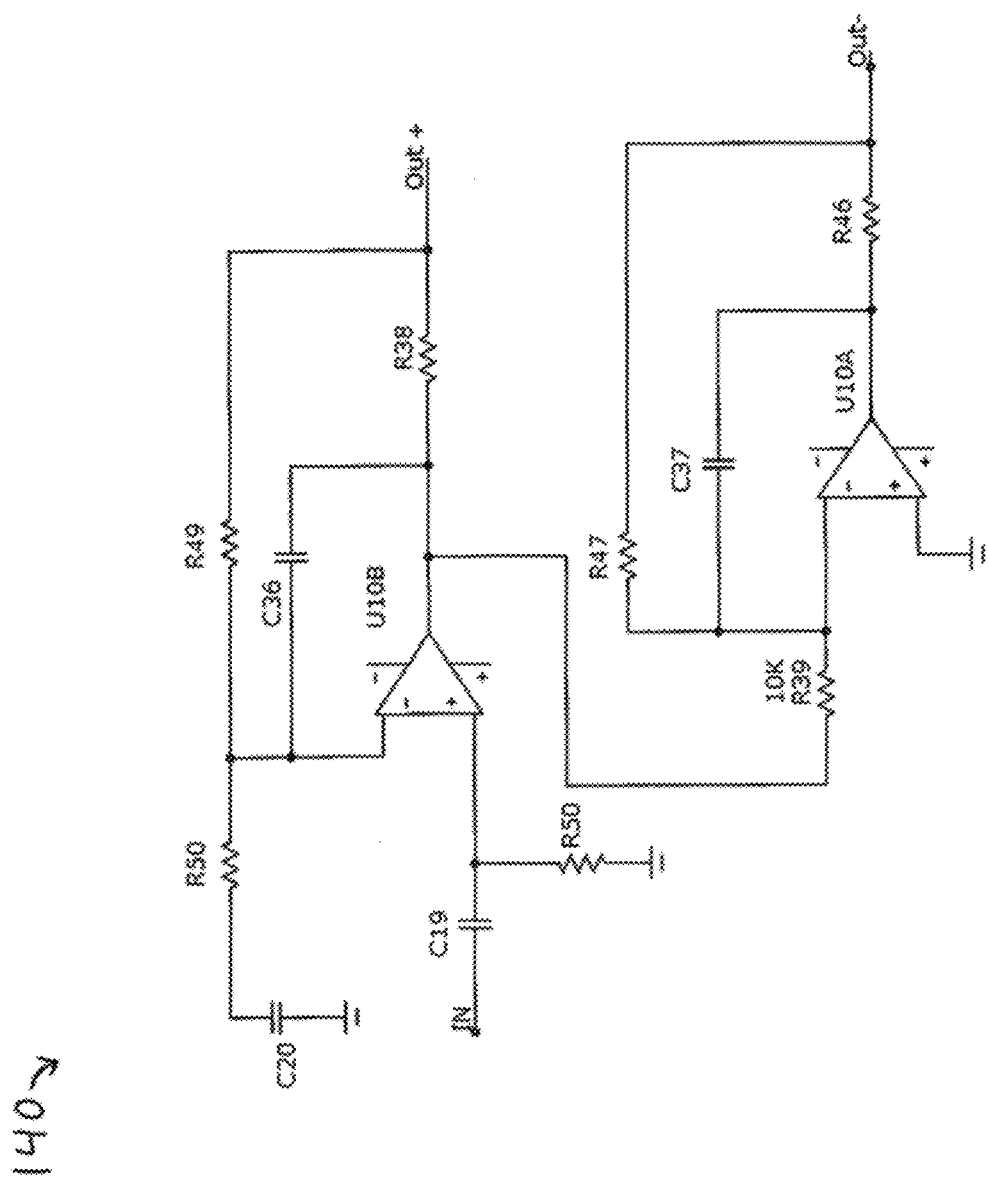
FIG. 7 shows a combined amplifier line driver circuit portion of an exemplary RPA module.

The outputs of the field director are fed to a combined amplifier line driver circuit 140, shown in FIG. 7, that amplifies the Sin and Cos signals to a level where they can be processed by the resolver-to-digital converter. In this application the outputs of the field director are high-level signals so a low gain circuit is used. The circuit is AC coupled, which minimizes the DC offset at the output of the amplifier. As with the driver circuit for the Inductosyn amplifiers, the driver design provides low output impedance while isolating the driver from the cable capacitance to ensure stability and uses the same dual-feedback technique previously described.

Figure 8:
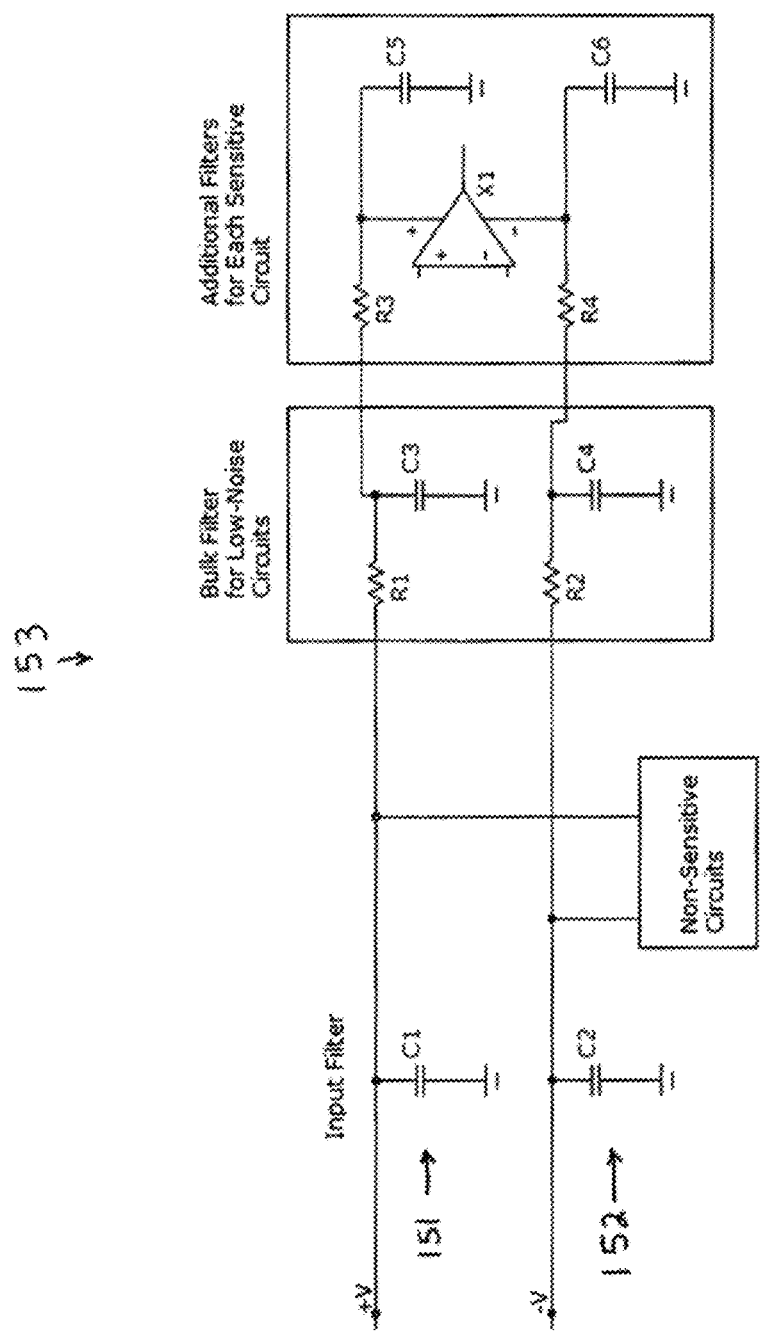
FIG. 8 shows a first and second stage power supply decoupling portion of an exemplary RPA module.
Figure 9:
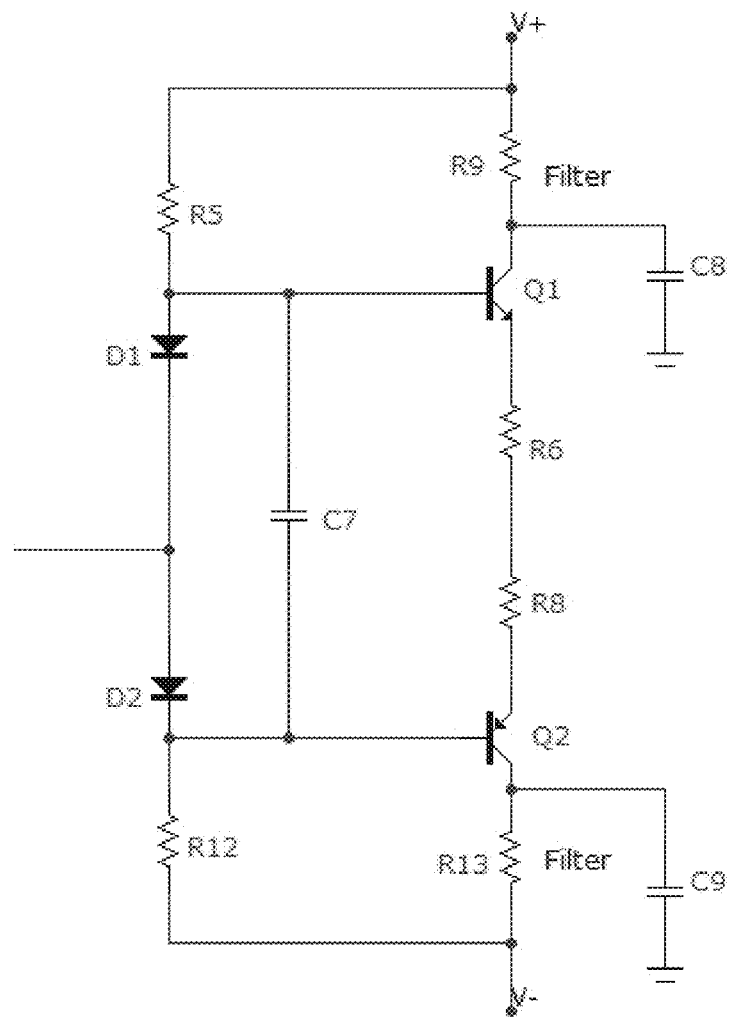
FIG. 9 shows a power output stage configured to drive the Inductosyn primary.

Referring now to FIGS. 8 and 9, the exemplary module includes extensive power supply decoupling to keep noise on the power rails from feeding into the recovery amplifier chain. Capacitors 151, 152 on the input power rails provide the first stage of filtering for the design. For the sensitive low-noise circuitry, a two-stage filter topology is used. A bulk RC filter 153 provides a second stage of filtering for all the high gain amplifier stages, and an individual RC filter is provided for each op amp in the amplifier chain. Additionally, the excite drive circuit 110 includes filters to keep the drive signal that drives the Inductosyn from modulating the power rails.

Figure 10:
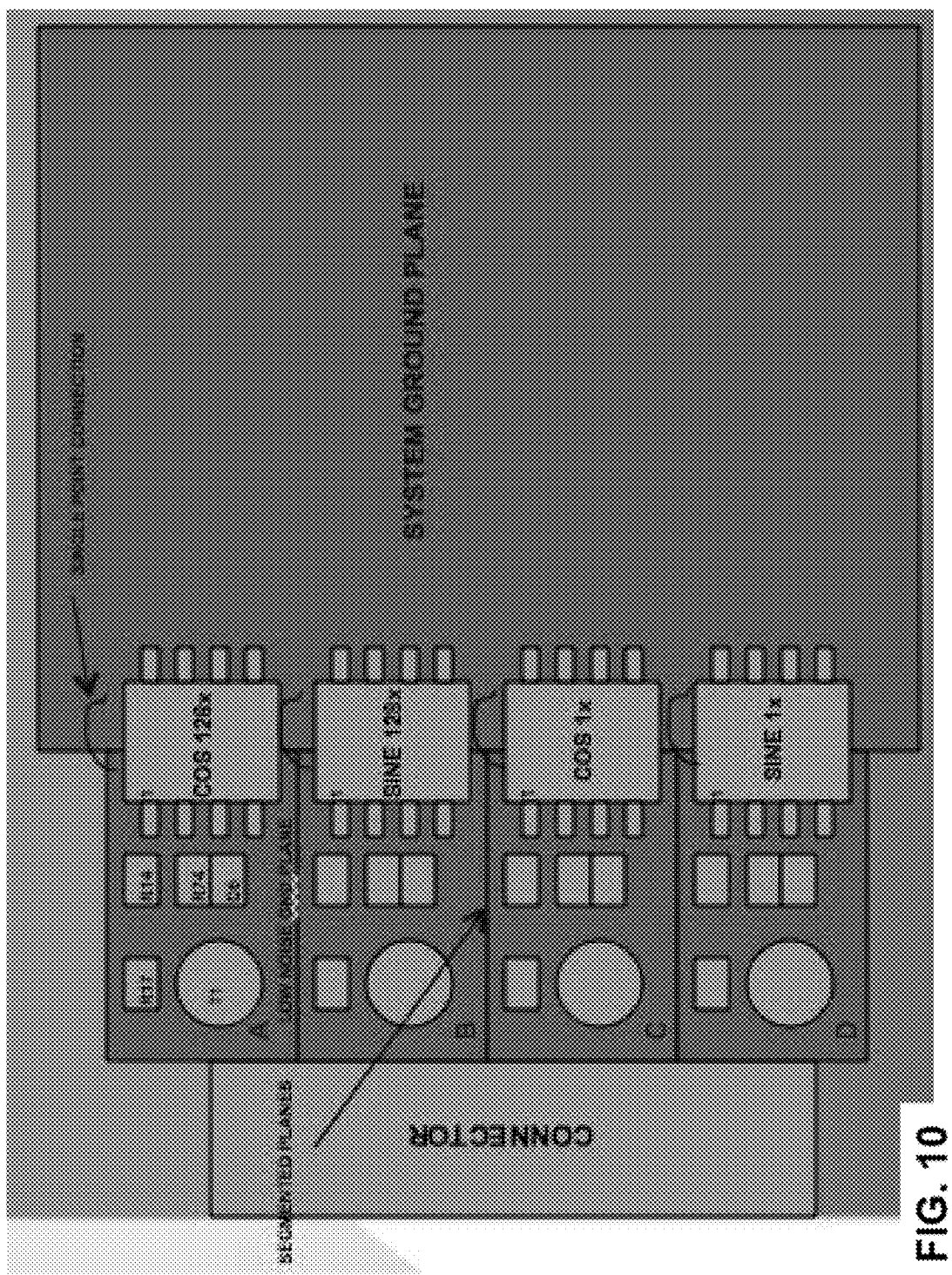
FIG. 10 shows a schematic representation of an exemplary PCB board.

Referring now to FIG. 10, in exemplary embodiments the Printed Circuit Board (PCB) is designed with multiple layers to shield and isolate signals. Circuit functions and routing are arranged to provide minimal signal coupling with adjacent circuits. Individual layers include isolated ground planes and guard rings to isolate sensitive circuitry. Grounding is a significant performance issue. As such, the low level signals come into the PCB through the connector on the left side. The Inductosyn 127× and 128×SIN and COS signals are treated as separate analog channels (channel 1-4). Each channel goes to a different pre-amp purposely separated in segmented "islands" denoted by the letters A-D. In addition, the underlying ground planes are segmented according to the channel input circuitry to prevent inner channel currents from coupling with one another.

Figure 11:
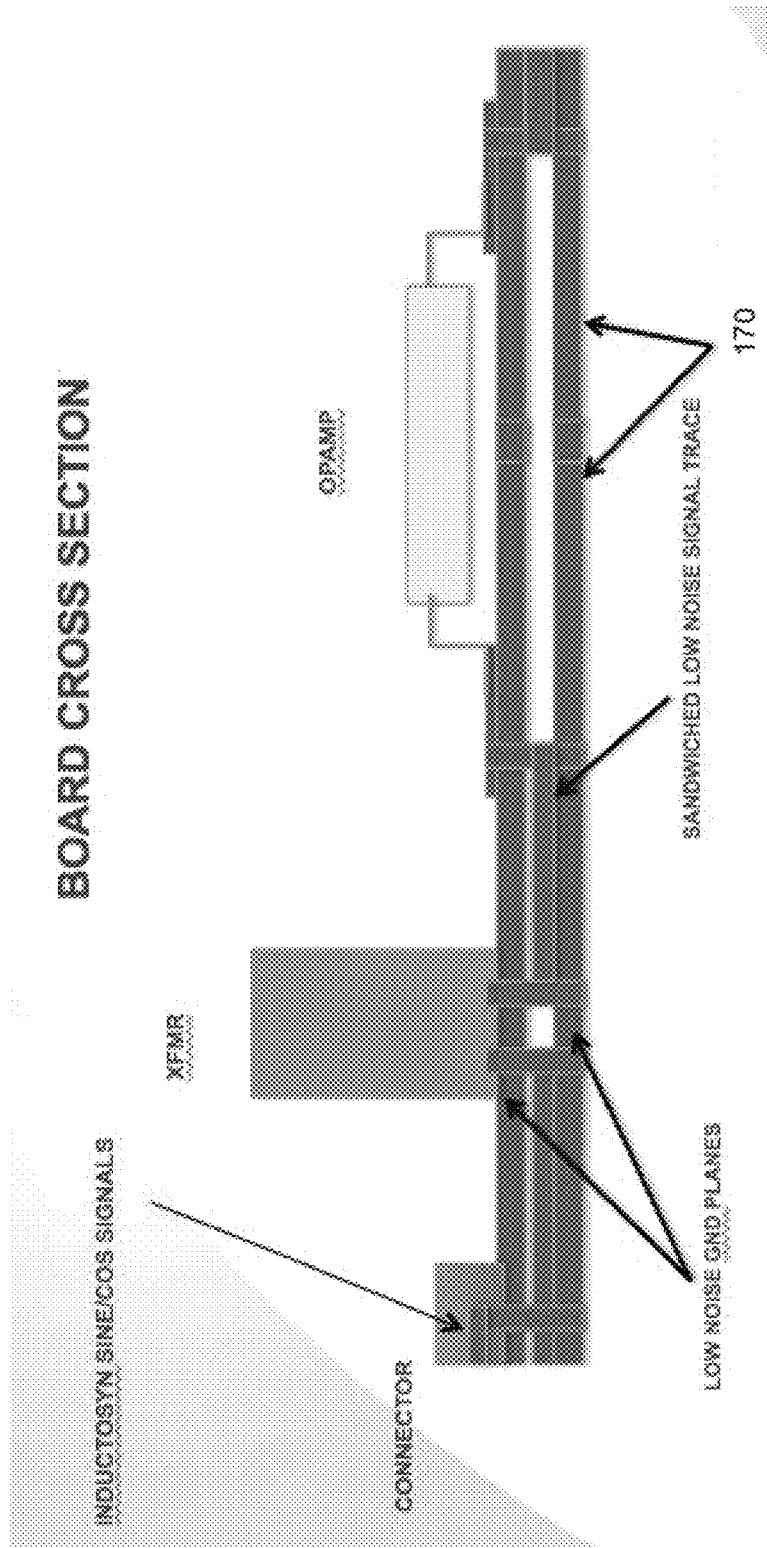
FIG. 11 shows a schematic cross-sectional view of an exemplary PCB board.

Referring now to FIG. 11, the input signal path is routed in a sub-layer surrounded by segmented ground planes 170 to further reduce noise coupling. After the pre-amp, the segmented ground planes are again joined as one analog ground plane in a star ground.

Even with exemplary Compact RPA Module's compact dual-board design, the ability to provide signal-to-noise isolation and reduction of crosstalk between the signals flowing on the PCBs is retained. This allows the RPA module to provide accurate absolute joint position telemetry to the robotic arm control electronics to support high-fidelity knowledge of robotic arm joint position during robotic operations. Exemplary embodiments support Inductosyns being used in applications where, previously, reliable operation has been problematic due to the limitations of conventional systems, especially for applications requiring small form factors.

Figure 12:
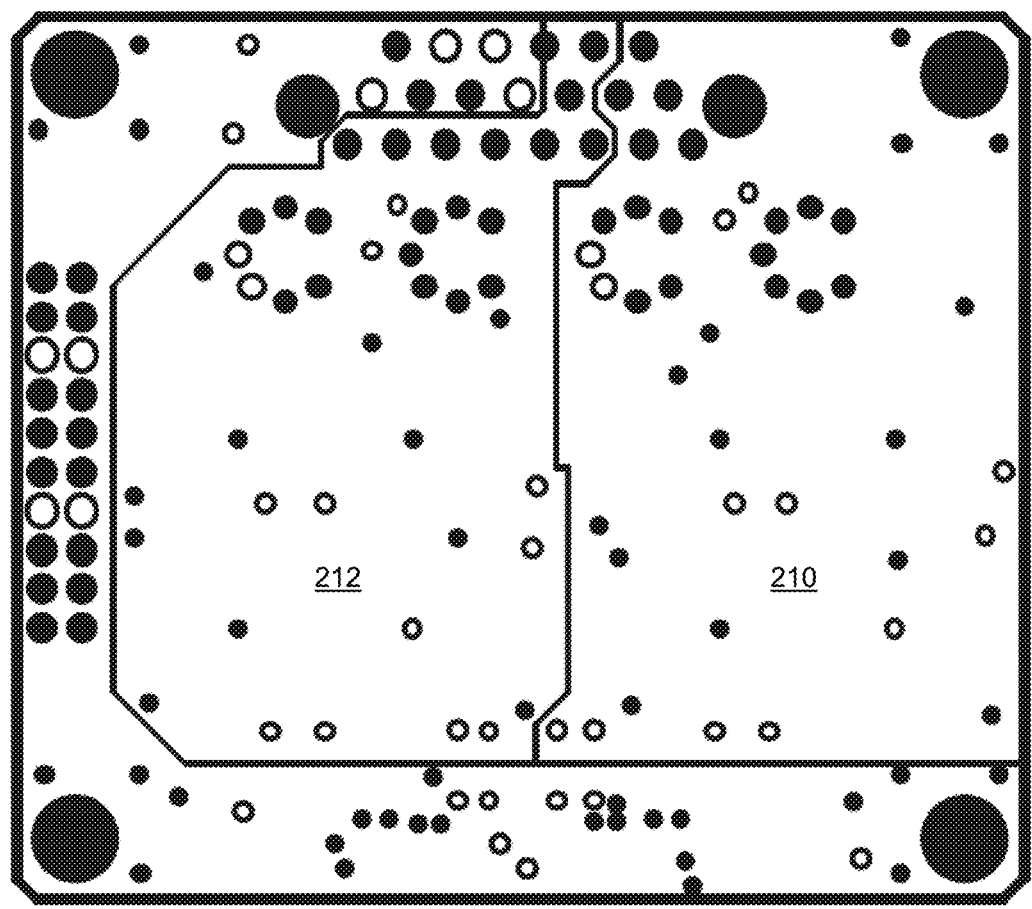
FIG. 12 shows a ground plane (layer 2) of an exemplary RPA module top board.
Figure 13:
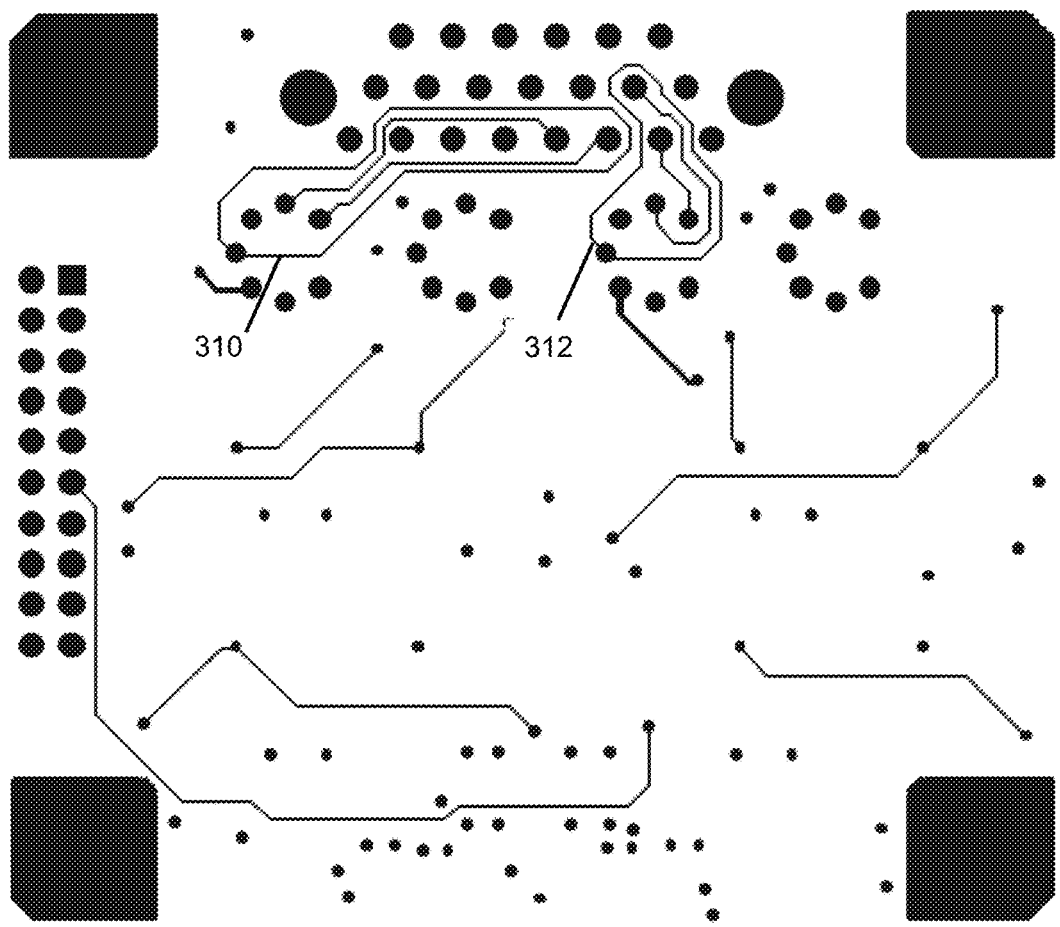
FIG. 13 shows an inner signal layer (layer 3) of an exemplary RPA module top board.
Figure 14:
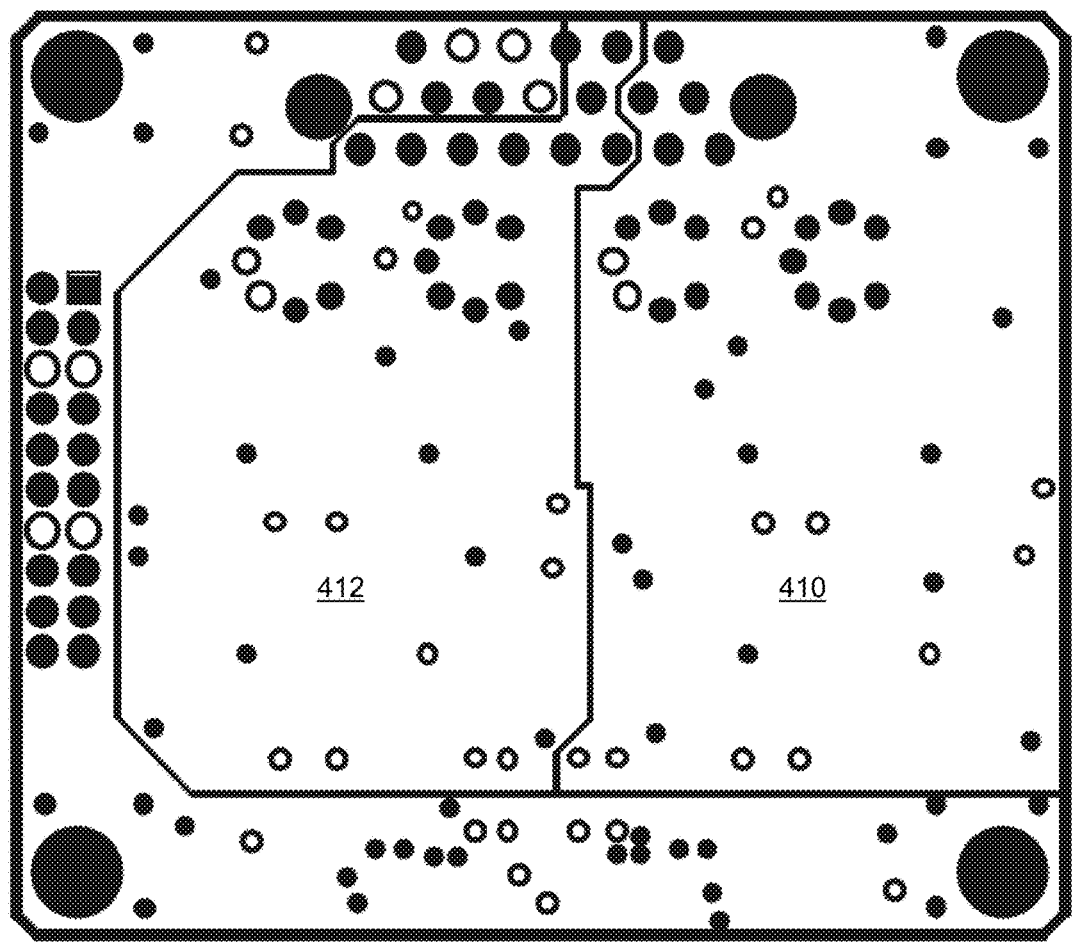
FIG. 14 shows a ground plane (layer 4) of an exemplary RPA module top board.
Figure 15:
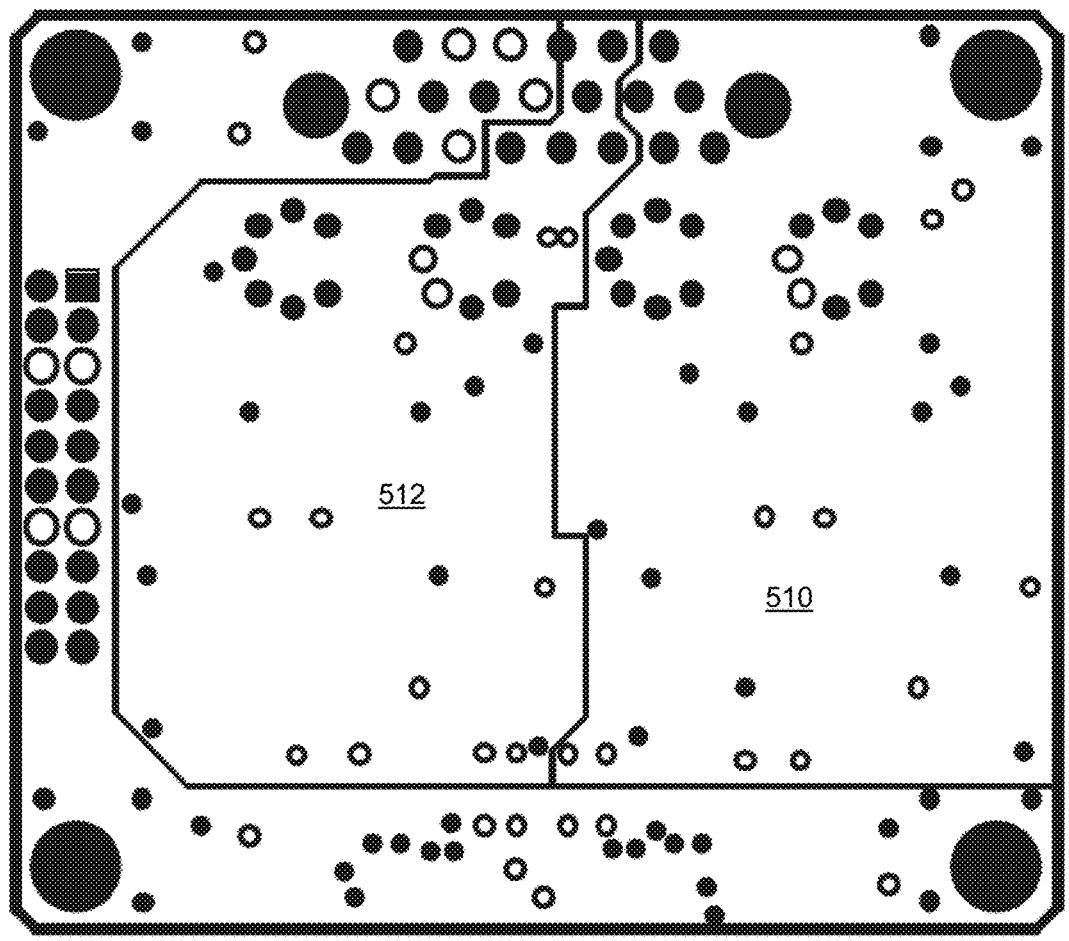
FIG. 15 shows a ground plane (layer 9) of an exemplary RPA module top board.
Figure 16:
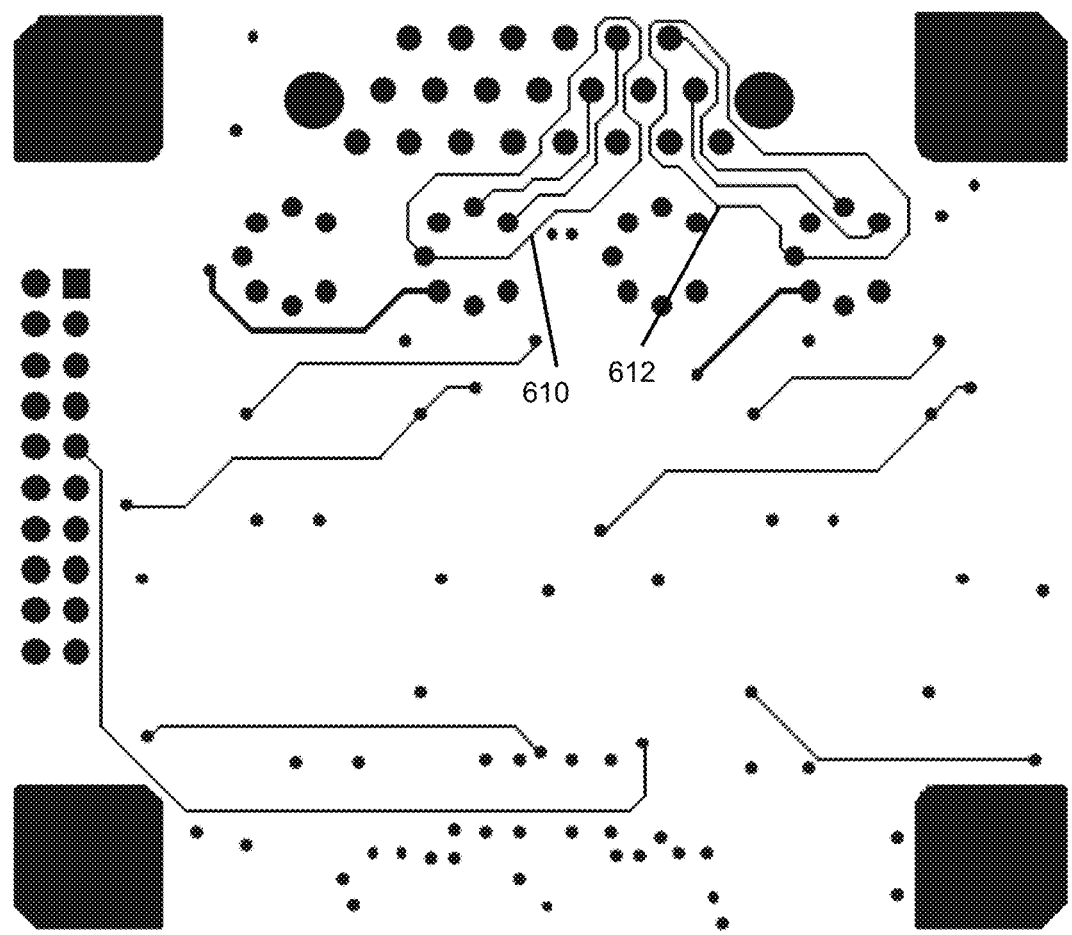
FIG. 16 shows an inner signal layer (layer 10) of an exemplary RPA module top board.
Figure 17:
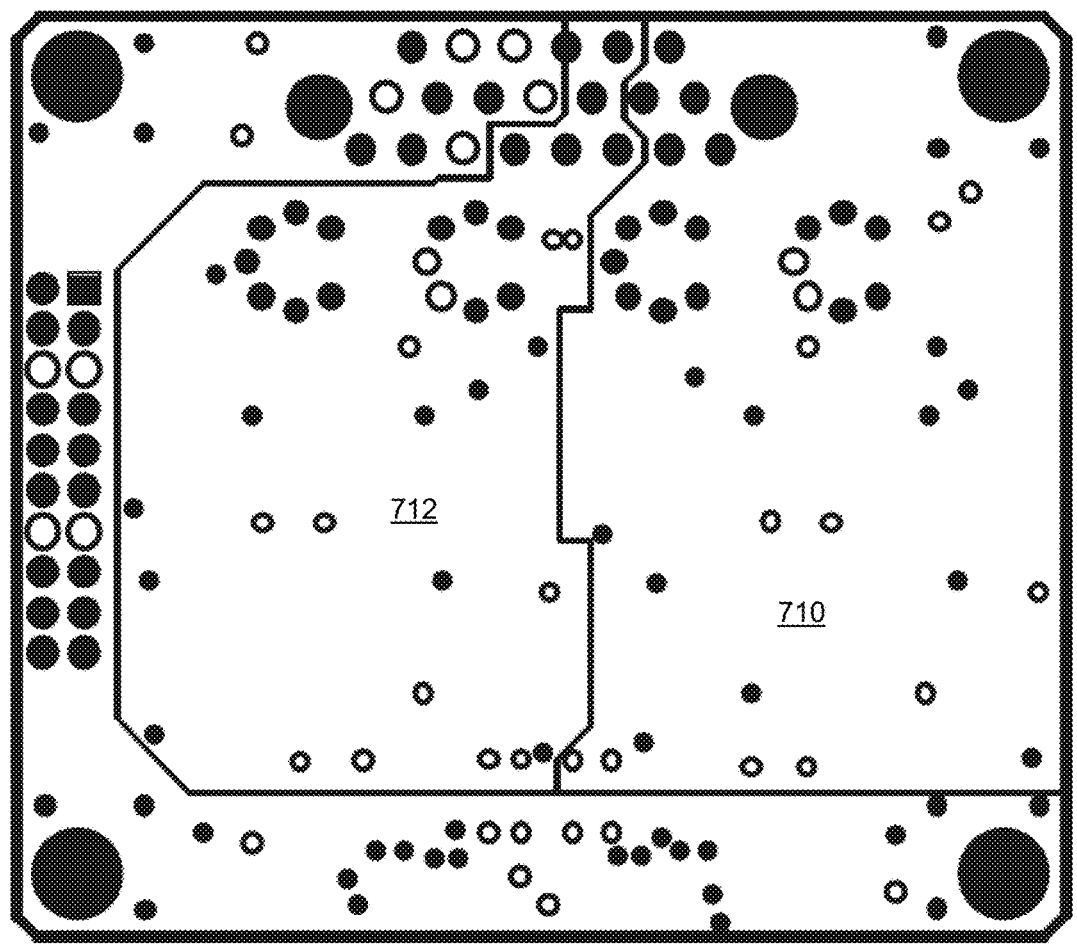
FIG. 17 shows a ground plane (layer 11) of an exemplary RPA module top board.

Turning now to FIG. 12-17, shown are various exemplary layer specifications for an exemplary top board. FIG. 12 shows a ground plane (layer 2) of an exemplary RPA module top board. FIG. 13 shows an inner signal layer (layer 3) of an exemplary RPA module top board. FIG. 14 shows a ground plane (layer 4) of an exemplary RPA module top board. FIG. 15 shows a ground plane (layer 9) of an exemplary RPA module top board. FIG. 16 shows an inner signal layer (layer 10) of an exemplary RPA module top board. FIG. 17 shows a ground plane (layer 11) of an exemplary RPA module top board. The top board gain structure implements three gain stages per channel to minimize interaction between the amplifiers. The PWB configuration is unique in this application due to the level of complexity used to maintain segregation/isolation between corresponding 1× and 128× channels, segregation of associated power and ground planes for each channel, and additional ground shield layers above and below the signal layers implemented within the PWB stack up. PWB stack up distances/tolerances between layers and locations of each layer maintain the noise isolation/rejection. Further isolation is achieved within the PWB by maintaining all COS signal, power, and ground traces and planes on the top 6 layers of the board and all SIN signal, power and ground traces/planes to the bottom 6 layers of the board.

The stack up and distances between the layers is arranged to provide signal separation and isolation as described below.

PWB layers 2, 3, and 4 form the isolation stack up for the sensitive 1×COS and 128×COS signal amplifiers. The COS sensitive signals are routed on layer 3 and are located between specific segmented ground planes on layers 2 and 4. These ground planes provide electromagnetic shielding for the sensitive signals on layer 3. See FIGS. 12-14.

Referring specifically to FIG. 12, (layer 2), the configuration includes a segmented ground plane having first and second portions 210, 212 for the COS amplifier channels, 1×COS, and 128×COS, respectively. This plane provides a top shield layer for the sensitive signals on layer 3, shown in FIG. 13

Referring now to FIG. 13, layer 3 is shown and is the signal layer. This layer routes the sensitive 1× and 128×COS signals. These signals are enclosed by guard rings 310, 312 to shield the sensitive input COS signals prior to the transformers. The 1×COS signal is enclosed by guard ring 312 and the 128×COS signal is enclosed by guard ring 310.

Referring now to FIG. 14, layer 4 is shown, and depicts the bottom segmented ground plane, 410, 412 for the COS amplifier channels 1×COS and 128×COS, respectively. This plane provides a bottom shield layer for the sensitive signals on layer 3.

Board layers 5, 6, 7, and 8 form stack up that provides isolated power to each of the amplifier channels.

Similar to layers 2, 3, and 4, board layers 9, 10, and 11 form the isolation stack up for the sensitive 1×SIN and 128×SIN signal amplifiers. The SIN sensitive signals are routed on layer 10 and are located between specific segmented ground planes on layers 9 and 11. These ground planes provide critical electromagnetic shielding for the sensitive signals on layer 10. See FIGS. 15-17

Referring now to FIG. 15, ground layer 9 is shown. The configuration of this layer utilizes a segmented ground plane 510, 512 for the SIN amplifier channels 1×SIN and 128× SIN, respectively. This plane provides a top shield layer for the sensitive signals on layer 10.

Referring now to FIG. 16, signal layer 10 is shown. This layer routes the sensitive 1× and 128×SIN signals. These signals are enclosed by critical guard rings 610, 612 to shield the sensitive input SIN signals prior to the transformers. The 1×SIN signal is enclosed by guard ring 612 and the 128×SIN signal is enclosed by guard ring 610.

Referring now to FIG. 17, ground layer 11 is shown. This layer includes the bottom segmented ground plane 710, 712 for the SIN amplifier channels, 1×SIN and 128×SIN, respectively. This plane provides a bottom shield layer for the sensitive signals on layer 10.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A compact resolver pre-amplification assembly having first and second printed circuit boards, the circuit boards comprising:
    an interface with a resolver and a resolver-to-digital converter;
    a first signal path including circuitry configured to drive a field director and resolver primaries, wherein the first signal path is configured to receive a differential signal from robotic control electronics, condition the signal, and then amplify the signal, driving the field director and resolver primaries;
    a second signal path including circuitry configured to amplify, condition, and output, to a differential output, sine (Sin) and cosine (Cos) outputs from a field director secondary; and
    a third signal path including circuitry configured to amplify, condition, and convert, to a differential signal, sine and cosine outputs from a resolver secondary,
    wherein the first and second circuit boards are contained in a single package configured for mounting on a robotic joint, and
    wherein low level sensitive signal are separated from high level excite signals by locating sensitive signals on the first board and excite signals on the second board.

2. The compact resolver pre-amplification assembly of claim 1, further comprising an excite drive circuit having a differential line receiver, a phase adjustment circuit, and a power output stage configured to drive the resolver primary.

3. The compact resolver pre-amplification assembly of claim 1, further comprising:
    recovery amplifiers configured to provide high gain, amplifying recovered Sin and Cos signals for input to a resolver-to-digital converter.

4. The compact resolver pre-amplification assembly of claim 3, wherein the recovery amplifiers include three amplifier stages and a unity gain differential line drive circuit driving amplified signals to the resolver-to-digital converter.

5. The compact resolver pre-amplification assembly of claim 4, wherein a first gain stage includes a 10:1 input transformer configured to provide galvanic isolation and high common-mode rejection and RF filtering, reducing the coupling of anomalous signals into the amplifiers.

6. The compact resolver pre-amplification assembly of claim 5, wherein the input transformer has a low primary resistance to minimize a Johnson noise and is housed in a magnetic shield.

7. The compact resolver pre-amplification assembly of claim 1, further comprising:
    a line driver circuit including inverting and non-inverting unity gain amplifiers configured to provide a differential signal output to interface with resolver-to-digital converter receivers and interconnecting cables,
    wherein the line driver circuit is configured to provide a low output impedance while isolating the line driver circuit from a cable capacitance to ensure stability.

8. The compact resolver pre-amplification assembly of claim 7, wherein the line driver circuit provides a DC feedback path taken from outside of an isolation resistor lowering an output impedance, and an AC feedback path taken directly at an op-amp output ensuring high frequency stability.

9. The compact resolver pre-amplification assembly of claim 1, further comprising:
    power supply decoupling capacitors on input power rails.

10. The compact resolver pre-amplification assembly of claim 1, further comprising:
    a bulk RC filter configured to provide a second stage of filtering for all high gain amplifier stages; and
    an individual RC filter for each op-amp of the recovery amplifiers.

11. The compact resolver pre-amplification assembly of claim 1, wherein the printed circuit boards include multiple layers shielding and isolating signals.

12. The compact resolver pre-amplification assembly of claim 1, wherein the printed circuit boards include circuit functions and routing arranged to provide minimal signal coupling with adjacent circuits.

13. The compact resolver pre-amplification assembly of claim 1, wherein individual layers include isolated ground planes and guard rings to isolate sensitive circuitry.

14. The compact resolver pre-amplification assembly of claim 1, wherein resolver 127× and 128×SIN and COS signals are treated as four separate analog channels and are segregated to separate pre-amp islands each associated with respective segmented underlying ground planes, preventing inner channel currents from coupling with one another.

15. The compact resolver pre-amplification assembly of claim 1, wherein the input signal path is routed in a sub-layer surrounded by segmented ground planes thereby reducing a noise coupling, and
    downstream of the pre-amp, the segmented ground planes are joined as one analog ground plane in a star ground.

16. The compact resolver pre-amplification assembly of claim 1, wherein isolation between the excite drive signal and the high-gain amplifiers exceeds 50 dB while providing gains that range from 3000 to 5000.

17. The compact resolver pre-amplification assembly of claim 1, wherein the first board includes twelve layers, and wherein:
    layer 2 includes a first segmented ground plane,
    layer 3 includes two sensitive signal routings,
    layer 4 includes a second segmented ground plane,
    layer 9 includes a third segmented ground plane,
    layer 10 includes two sensitive signal routings separate from the signal routings on layer 3, and
    layer 11 includes a fourth segmented ground plane.

18. The compact resolver pre-amplification assembly of claim 1, wherein the first board includes twelve layers and wherein:
- layer 3 includes two sensitive signal routings, each routing being enclosed by a respective guard ring, shielding input signals upstream of one or more transformers, and
- layer 10 includes two sensitive signal routings separate from the signal routings on layer 3, each routing being enclosed by a respective guard ring, shielding input signals upstream of one or more transformers.

19. The compact resolver pre-amplification assembly of claim 1, wherein the first board includes twelve layers and wherein:
- layers 5, 6, 7, and 8 each include a power plane separated into two channels that are connected at one point, thereby preventing a noise from flowing between adjacent circuits.

20. The compact resolver pre-amplification assembly of claim 1, in combination with a robotic arm and a second compact resolver pre-amplification assembly,
- wherein the compact resolver pre-amplification assemblies are mounted on and receive information from respective joints of the robotic arm.

* * * * *